(12) United States Patent
Shih et al.

(10) Patent No.: US 12,176,063 B2
(45) Date of Patent: Dec. 24, 2024

(54) COMPUTING-IN-MEMORY ARCHITECTURE

(71) Applicant: Taiwan Semiconductor Manufacturing Company, Ltd., Hsinchu (TW)

(72) Inventors: Yi-Chun Shih, Taipei (TW); Chia-Fu Lee, Hsinchu (TW); Yu-Der Chih, Hsinchu (TW); Jonathan Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/884,650

(22) Filed: Aug. 10, 2022

(65) Prior Publication Data
US 2022/0415373 A1 Dec. 29, 2022

Related U.S. Application Data

(63) Continuation of application No. 17/337,889, filed on Jun. 3, 2021, now Pat. No. 11,450,364.
(Continued)

(51) Int. Cl.
*G11C 7/12* (2006.01)
*G11C 5/06* (2006.01)
(Continued)

(52) U.S. Cl.
CPC .............. *G11C 7/12* (2013.01); *G11C 5/06* (2013.01); *G11C 7/1045* (2013.01);
(Continued)

(58) Field of Classification Search
CPC ...................................................... G11C 7/12
(Continued)

(56) References Cited

U.S. PATENT DOCUMENTS

| | | | | |
|---|---|---|---|---|
| 6,737,695 B2 * | 5/2004 | Beer | ...................... | H01L 29/945 438/242 |
| 8,861,290 B2 * | 10/2014 | Zimmer | ................ | G11C 11/419 365/233.5 |

(Continued)

FOREIGN PATENT DOCUMENTS

| | | |
|---|---|---|
| CN | 110914983 | 3/2020 |
| TW | 201025352 | 7/2010 |
| TW | 201730883 | 9/2017 |

OTHER PUBLICATIONS

Chinese Office Action; Application No. 202110994530.2; Dated Jun. 13, 2023.

(Continued)

*Primary Examiner* — Muna A Techane
(74) *Attorney, Agent, or Firm* — Jones Day

(57) ABSTRACT

Systems and methods are provided for a computing-in memory circuit that includes a bit line and a plurality of computing cells connected to the bit line. Each of the plurality of computing cells includes a memory element, having a data output terminal; a logic element, having a first input terminal, a second input terminal and an output terminal, wherein the first input terminal is coupled to the data output terminal of the memory element, the second input terminal receives a select signal; and a capacitor, having a first terminal and a second terminal, where the first terminal is coupled to the output terminal of the logic element, the second terminal is coupled to the bit line. A voltage of the bit line is driven by the plurality of computing cells.

20 Claims, 8 Drawing Sheets

| SEL | Q | SELB | QB | NC |
|---|---|---|---|---|
| 0 | 0 | 1 | 1 | 0 |
| 0 | 1 | 1 | 0 | 0 |
| 1 | 0 | 0 | 1 | 0 |
| 1 | 1 | 0 | 0 | 1 |

PRE-CHARGE LOW

Related U.S. Application Data

(60) Provisional application No. 63/070,863, filed on Aug. 27, 2020.

(51) Int. Cl.
*G11C 7/10* (2006.01)
*G11C 16/04* (2006.01)
*G11C 16/30* (2006.01)

(52) U.S. Cl.
CPC ........ *G11C 7/1048* (2013.01); *G11C 16/0433* (2013.01); *G11C 16/30* (2013.01)

(58) Field of Classification Search
USPC ........................................................ 365/203
See application file for complete search history.

(56) References Cited

U.S. PATENT DOCUMENTS

| | | | |
|---|---|---|---|
| 9,324,392 B1* | 4/2016 | Asenov | G11C 11/418 |
| 9,722,828 B2 | 8/2017 | Sun et al. | |
| 9,734,910 B1* | 8/2017 | Park | G11C 16/0433 |
| 10,360,971 B1* | 7/2019 | Hokenmaier | G11C 11/54 |
| 11,024,358 B1 | 6/2021 | Srivastava | |
| 11,194,490 B1* | 12/2021 | Sunkavalli | G06F 3/0673 |
| 2010/0208505 A1 | 8/2010 | Turier et al. | |
| 2017/0117034 A1* | 4/2017 | Hebig | G11C 11/419 |
| 2019/0102359 A1* | 4/2019 | Knag | G06G 7/16 |
| 2019/0392896 A1* | 12/2019 | Chung | G11C 13/0026 |
| 2021/0027814 A1* | 1/2021 | Mahatme | H04L 9/0866 |

OTHER PUBLICATIONS

Taiwan Notice of Allowance; Application No. 110130008; dated Dec. 30, 2021.

\* cited by examiner

COMPUTING-IN-MEMORY ARCHITECTURE

CROSS-REFERENCE TO RELATED APPLICATIONS

This application is a continuation of U.S. patent application No. 17/337,889, filed Jun. 3, 2021, entitled "Computing-In-Memory Architecture," which claims priority to U.S. Provisional Application No. 63/070,863, filed Aug. 27, 2020, entitled "Novel Computing-In-Memory Architecture," each of which is incorporated herein by reference in their entirety.

TECHNICAL FIELD

This disclosure is related to data access and particularly, in embodiments, to high speed, power efficient large-scale access to data in an array of memory cells.

BACKGROUND

Global data generation continues to grow at an exponential pace, in many cases dwarfing the growth of data processing capability. Limitations on processing capabilities may in some instances hinder the ability of one to benefit from large amounts of data being created and captured.

BRIEF DESCRIPTION OF THE DRAWINGS

Aspects of the present disclosure are best understood from the following detailed description when read with the accompanying figures.

DETAILED DESCRIPTION

Figure 1:
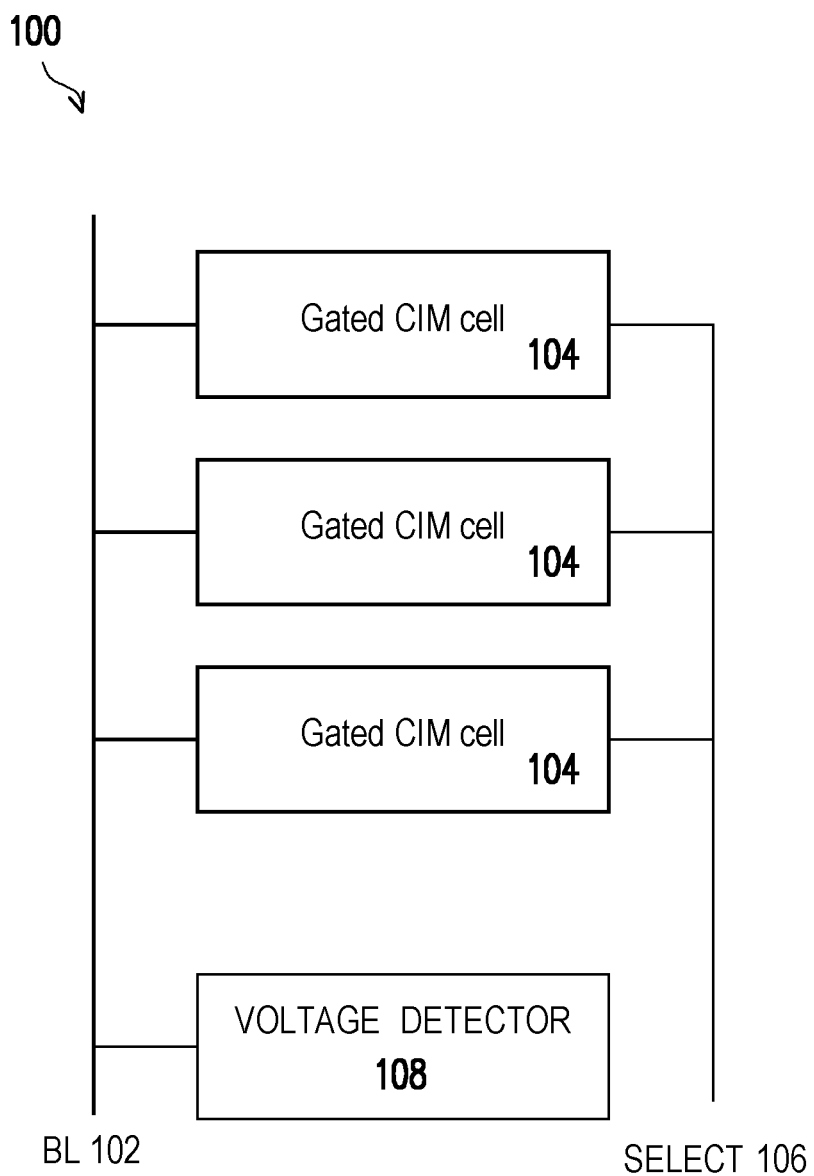
FIG. 1 is a memory circuit that includes an array of gated computing cells in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The exponential growth of data generation and capture provides tremendous opportunity for technological advancement. But because certain areas of technology are not experiencing corresponding growth rates, the cost of accessing and processing that data to enjoy its full benefit can be quite large. For example, there is a time and power cost associated with accessing data, providing that accessed data to a data processor, and processing that data. Systems and methods as provided herein can, in embodiments, reduce certain of those costs by providing simultaneous access to data stored in many memory locations simultaneously, including performing access and computing operations on that data in the memory (e.g., without use of an external process). For example, a memory device (e.g., an SRAM-based memory) may be configured to simultaneous access data from a large number of memory locations and to output a count associated with that data (e.g., a count of how many memory locations store a "1" value).

FIG. 1 is a memory circuit that includes an array of gated computing cells in accordance with an embodiment. The memory circuit 100 includes a bit line 102 and a plurality of computing memory cells 104, which may in some circumstances be referred to as computing-in-memory (CIM) cells. Each of the computing cells 104 is connected to the bit line 102. Each of the computing cells 104 includes a memory element as well as logic for applying a signal to the bit line 102, where a signal on the bit line 102 is generated based on contributions from all selected computing cells 104. In the example of FIG. 1, each computing memory cell 104 receives a select signal 106, whereby the computing cells 104 are configured to apply any signal dictated by the data value stored in its memory therein to the bit line 102 based, at least in part, on receipt of the select signal 106. In the example of FIG. 1, all of the depicted computing cells 104 receive the select signal 106. In embodiments, all of the computing cells 104 of memory circuit 100 receive the same select signal 106. In other embodiments, subsets of the computing cells 104 receive differing select signals, enabling access and computation on less than all of computing cells 104 (e.g., a count of memory elements in cells 0-99 having a '1' value; a count of memory elements in cells 100-199 having a '1' value). In another example, the computing cells 104 may receive a global select signal and a "local" select signal, where computing cells 104 that receive either the global or local select signals are activated and configured to apply a signal to the bit line 102 (e.g., a count of memory elements in cells 0-99 having a '1' value when local select 1 is asserted; a count of memory elements in cells 0-199 having a '1' value when a global select signal is asserted). A signal level (e.g., a voltage) on the bit line 102 is driven collectively by contributions (or non-contributions) of the plurality of computing cells 104, where a detection device such as voltage detector 108 measures that signal level, where data can be ascertained from that signal level (e.g., a count of all selected computing cells whose memory elements have a '1' values).

Figure 2:
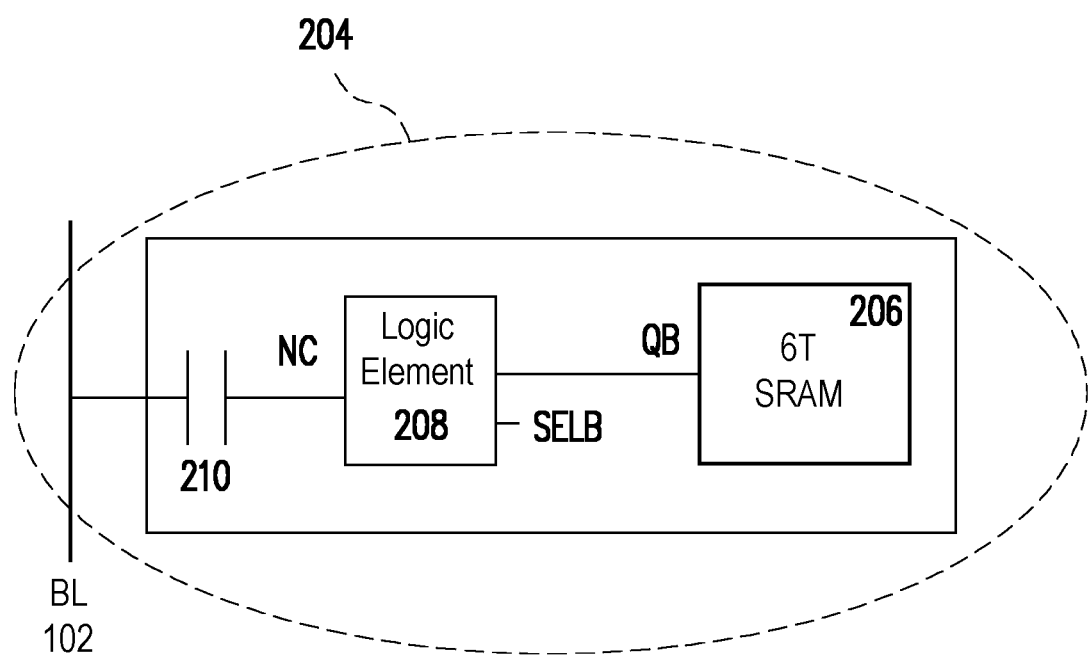
FIG. 2 is a diagram depicting a computing cell of a memory in accordance with an embodiment.

FIG. 2 is a diagram depicting a computing cell of a memory in accordance with an embodiment. As described above, a memory circuit includes a bit line 102 an a plurality of computing cells connected to the bit line 102, example details of one of those computing cells being depicted at 204. In the example of FIG. 2, the example computing cell includes a memory element 206 in the form of a six-transistor SRAM cell having a data output terminal, where in the example of FIG. 2 the data output terminal of the memory element provides a QB signal, which is an inverse representation of the data value stored in the memory element (e.g., QB is low when the memory element contains a '1' value, QB is high when the memory element 206 contains a low value), QB being provided either directly from the memory element or following an intervening inverter gate (not shown). The computing cell 204 further includes a logic element 208 having a first input terminal coupled to the data output terminal of the memory element 206 (receiving QB) and a second input terminal that receives a selection related signal (e.g., SELB, which is an inverse representation of the select signal (e.g., SELB is low when SEL is high, SELB is low when a SEL is high, where SELB is received from outside of the computing cell 204 or is generated using an inverter (not shown) based on an SEL signal received at the computing cell 204)). The computing cell further includes a capacitor 210 having a first terminal coupled to an output terminal of the logic element 208 (signal NC) and a second terminal coupled to the bit line 102.

In operation, the bit line 102 is precharged to a predetermined level (e.g., 0 V). A select signal (e.g., SELB) is received by each of the computing cells and is provided to the logic element 208 therein. When the computing cell 204 is not selected, the logic element 208 provides a default high or low value to its output node (NC), depending on memory circuit configuration (e.g., logic element 208 provides a default low value to its output node (NC) when the bit line 102 is precharged to a low level). When activated via the select signal, the logic element 208 provides an output (at NC) based on the data value stored in the memory element 206. In some examples, when activated via the select signal, the logic element 208 may pass through a signal indicative of the value stored in the memory element 206 to its output node (NC). In other examples, the logic element 208 may process the signal received from the memory element (e.g., by inverting that signal). The signal output from the logic element 208 influences the signal output on the bit line 102, alone or in combination with outputs from other computing cells, via capacitor 210.

Figure 3:
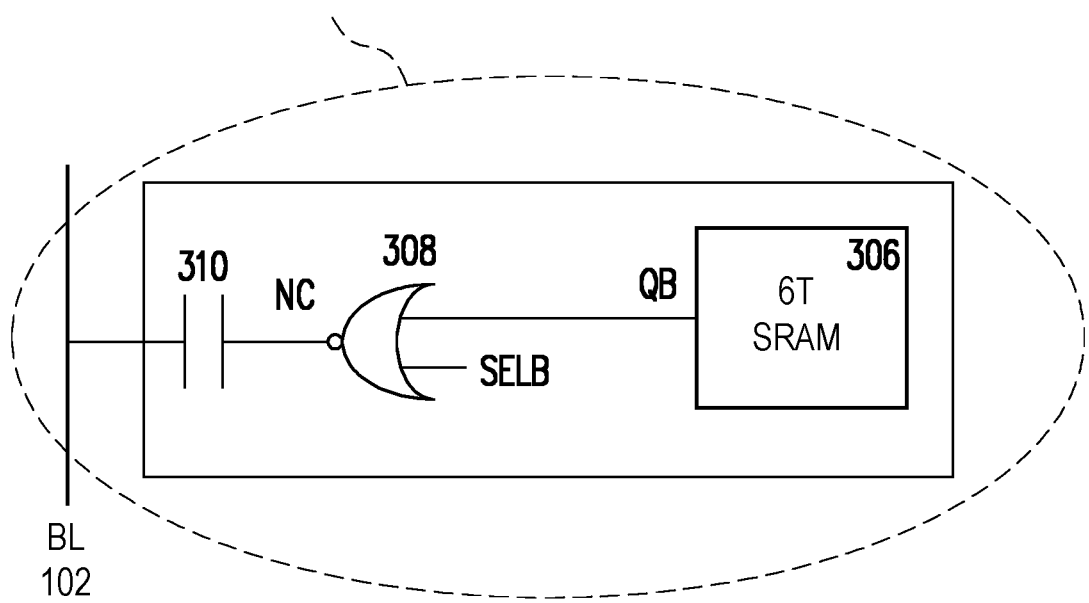
FIG. 3 is a diagram depicting a computing cell where the logic element is a not-OR (NOR) gate in accordance with embodiments.

FIG. 3 is a diagram depicting a computing cell where the logic element is a not-OR (NOR) gate in accordance with embodiments. In this example, the bit line 102 is precharged low and, when not selected, each computing cell 304 outputs a low signal. When selected, each computing cell 304 outputs a low signal when the data stored in its memory cell is '0' and a high signal when the data stored in its memory cell is '1.' The contributions of each of the computing cells providing a high signal output are accumulated on the bit line 102 such that a voltage level on the bit line 102 indicates the number of computing cells having memory elements with a '1' value.

Specifically, the computing cell 304 includes a memory element 306 whose data is used to produce an inverse data output at QB (e.g., QB is low when the memory element 306 contains a '1' value; QB is high when the memory element 306 contains a '0' value). A NOR logic element 308 receives the inverse data output QB and an inverse select signal SELB and produces an output signal at node NC. The output at NC drives, in part, a voltage at the bit line 102 via a capacitor 310.

Operation of the NOR gate is shown at 312, where when the select signal is high (SELB is low) and when the memory element stores a '1' value (QB is low), the NOR logic element 308 provides a high signal at output node NC, which drives the bit line 102 voltage up an incremental amount. In all other instances (e.g., when the computing cell is not selected, when the memory element stores a '0' value), the NOR logic element drives node NC low such that no incremental voltage contribution is made to bit line 102.

Figure 4:
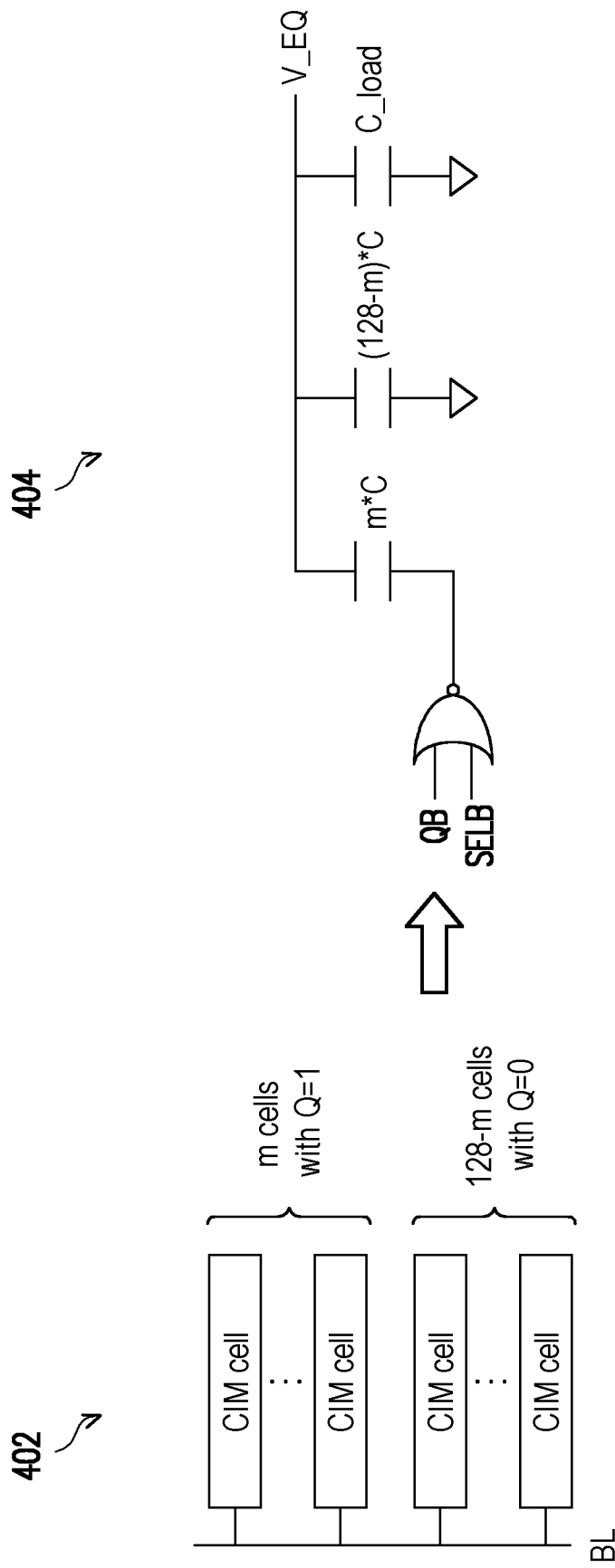
FIG. 4 is a diagram depicting an in-memory calculation of data based on data stored in memory elements in the memory, in accordance with an embodiment.

The signal level on the bit line 102 is indicative of data values stored in memory elements of the memory circuit. FIG. 4 is a diagram depicting an in-memory calculation of data based on data stored in memory elements in the memory, in accordance with an embodiment. In the example of FIG. 4, the memory circuit is configured to produce a signal on the bit line (V_EQ) from which a count of the number of selected memory elements storing a '1' value can be determined. The example of FIG. 4 includes an array of 128 computing cells, each having a memory element therein, each computing cell being connected to the bit line as illustrated at 402. m of those computing cells have memory elements storing a '1' value, while 128-m computing cells have memory elements storing a '0' value. As discussed above with reference to FIG. 3, in the NOR-logic element example that receives QB and SELB inputs, a selected computing cell will provide a high output when its memory element stores a '1' value, and that computing cell will provide a low (ground) output when its memory element stores a '0' value.

The memory circuit's effect on the bit line producing voltage V_EQ is illustrated at 404. There, m computing cells whose memory elements store a '1' are connected to the bit line via m capacitors providing m*C total capacitance between a high logic level and the bit line to contribute to production of V_EQ. Conversely (128-m) computing cells whose memory elements store a '0' are connected to the bit line via (128-m) capacitors providing (128-m)*C total capacitance between a low (ground/Vss) logic level and the bit line. A known load capacitance is also resent between the bit line and low logic level.

The bit line voltage V_EQ is then representative of:

$$V\_EQ=(m*C)/(n*C+C\_load),$$

where V is the detected voltage, m is the number of computing cells having the particular value, C is a capacitance of the capacitor, n is a total number of cells (e.g., 128), and C_load is a known load capacitance. A count of the m computing cells whose memory elements store a '1' value can then be determined by:

$$m=V\_EQ*(n*C+C\_load)/C$$

Figure 5:
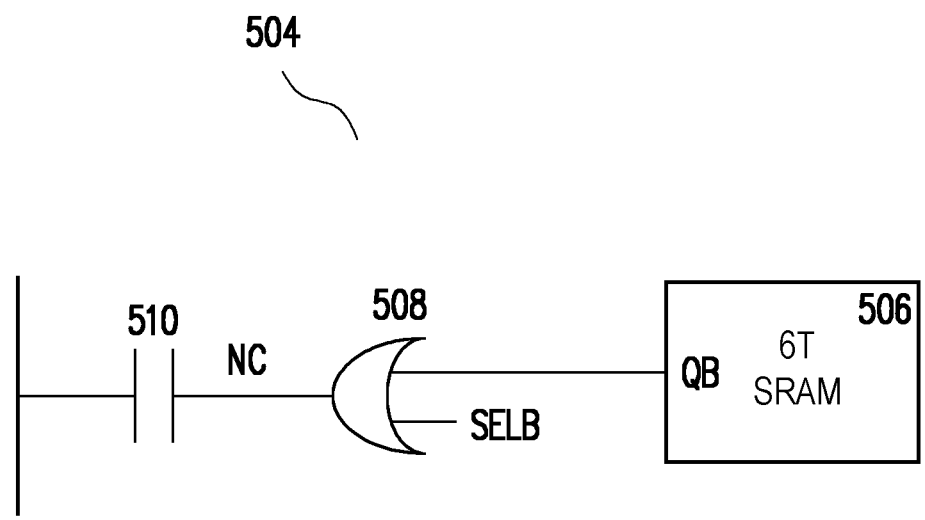
FIG. 5 is a diagram depicting a computing cell that utilizes an OR gate as a logic element, in accordance with an embodiment.

While the example of FIG. 3 was implemented using a NOR gate as a logic element, other examples may be utilized as well. FIG. 5 is a diagram depicting a computing cell that utilizes an OR gate as a logic element, in accordance with an embodiment. In this example, the bit line 102 is precharged high and, when selected, each computing cell 504 outputs a high signal when the data stored in its memory cell is '0' and a low signal when the data stored in its memory cell is '1,' incrementally pulling the bit line voltage down a detectable amount. The contributions of each of the computing cells providing a low signal output are accumulated on the bit line 102 such that a voltage level on the bit line 102 indicates the number of computing cells having memory elements with a '1' value.

Specifically, the computing cell 504 includes a memory element 506 whose data is used to produce an inverse data output at QB (e.g., QB is low when the memory element 506 contains a '1' value; QB is high when the memory element 506 contains a '0' value). An OR logic element 508 receives the inverse data output QB and an inverse select signal SELB and produces an output signal at node NC. The output at NC drives, in part, a voltage at the bit line 102 via a capacitor 510.

Operation of the OR gate is shown at 512, where when the select signal is high (SELB is low) and when the memory element stores a '1' value (QB is low), the OR logic element 508 provides a low signal at output node NC, which drives the bit line 102 voltage down an incremental amount. In all other instances (e.g., when the computing cell is not selected, when the memory element stores a '0' value), the OR logic element drives node NC high such that no incremental downward voltage contribution is made to bit line 102.

Figure 6:
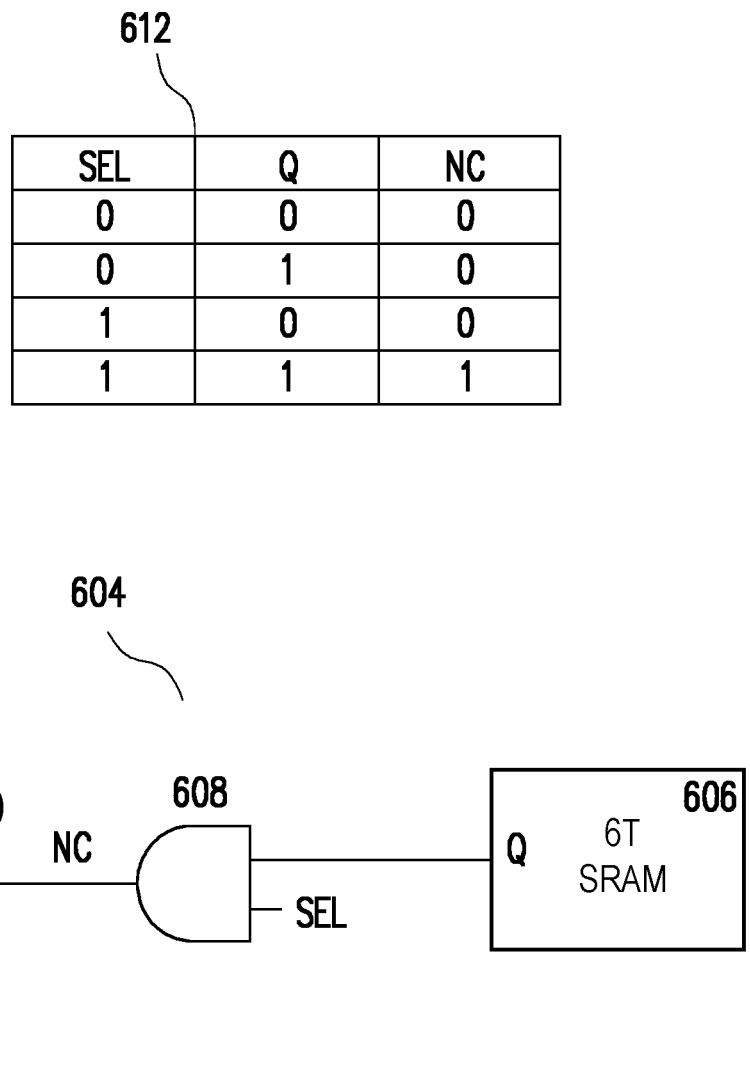
FIG. 6 is a diagram depicting a computing cell that utilizes an AND gate as a logic element, in accordance with an embodiment.

FIG. 6 is a diagram depicting a computing cell that utilizes an AND gate as a logic element, in accordance with an embodiment. In this example, the bit line 102 is precharged low and, when selected, each computing cell 604 outputs a low signal when the data stored in its memory cell is '0' and a high signal when the data stored in its memory cell is '1.' The contributions of each of the computing cells providing a high signal output are accumulated on the bit line 102 such that a voltage level on the bit line 102 indicates the number of computing cells having memory elements with a '1' value.

Specifically, the computing cell 604 includes a memory element 606 whose data is used to produce a data output at Q. An AND logic element 608 receives the data output Q and a select signal SEL and produces an output signal at node NC. The output at NC drives, in part, a voltage at the bit line 102 via a capacitor 610.

Operation of the AND gate is shown at 612, where when the select signal is high and when the memory element stores a '1' value, the AND logic element 608 provides a high signal at output node NC, which drives the bit line 102 voltage higher by an incremental amount. In all other instances (e.g., when the computing cell is not selected, when the memory element stores a '0' value), the AND logic element drives node NC low such that no incremental voltage contribution is made to bit line 102.

Figure 7:
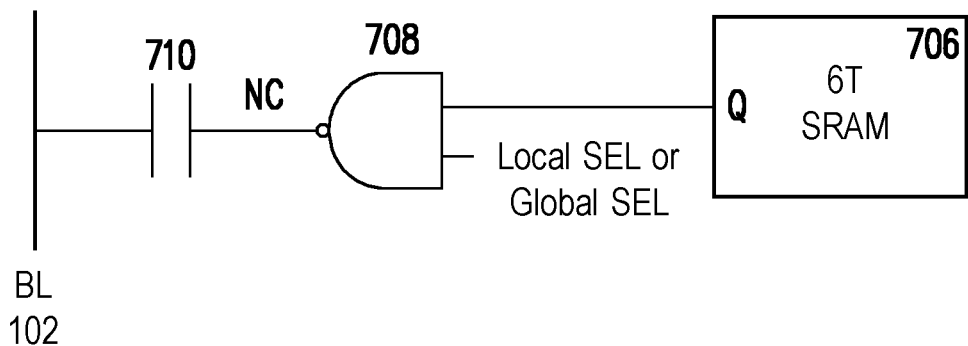
FIG. 7 is a diagram depicting a computing cell that utilizes an NAND gate as a logic element, in accordance with an embodiment.

FIG. 7 is a diagram depicting a computing cell that utilizes an NAND gate as a logic element, in accordance with an embodiment. In this example, the bit line 102 is precharged high and, when selected (e.g., by either of a local selection signal (selecting computing cells 0-63 of 128 cells or a global selection signal selecting all of computing cells 0-127), each computing cell 704 outputs a high signal when the data stored in its memory cell is '0' and a low signal when the data stored in its memory cell is '1.' The contributions of each of the computing cells providing a low signal output are accumulated on the bit line 102 such that a voltage level on the bit line 102 indicates the number of computing cells having memory elements with a '1' value.

Specifically, the computing cell 704 includes a memory element 706 whose data is used to produce a data output at Q. A Not-AND (NAND) logic element 708 receives the data output Q and a select signal SEL and produces an output signal at node NC. The output at NC drives, in part, a voltage at the bit line 102 via a capacitor 710.

Operation of the NAND gate is shown at 712, where when the select signal is high and when the memory element stores a '1' value, the NAND logic element 608 provides a low signal at output node NC, which drives the bit line 102 voltage lower by an incremental amount. In all other instances (e.g., when the computing cell is not selected, when the memory element stores a '0' value), the NAND logic element drives node NC high such that no incremental downward voltage contribution is made to bit line 102.

In embodiments, the Local SEL and Global SEL are decoded prior to reaching the computing cell 704 (e.g., by routing those two signals through an OR gate). In other examples, both the Local SEL and Global SEL signal are received at the computing cell 704 (e.g., on separate pins), where they are decoded in the computing cell 704, such as via an OR gate, such that the memory in the memory element 706 may contribute to the bit line voltage when either of the Local SEL or Global SEL are activated.

Figure 8:
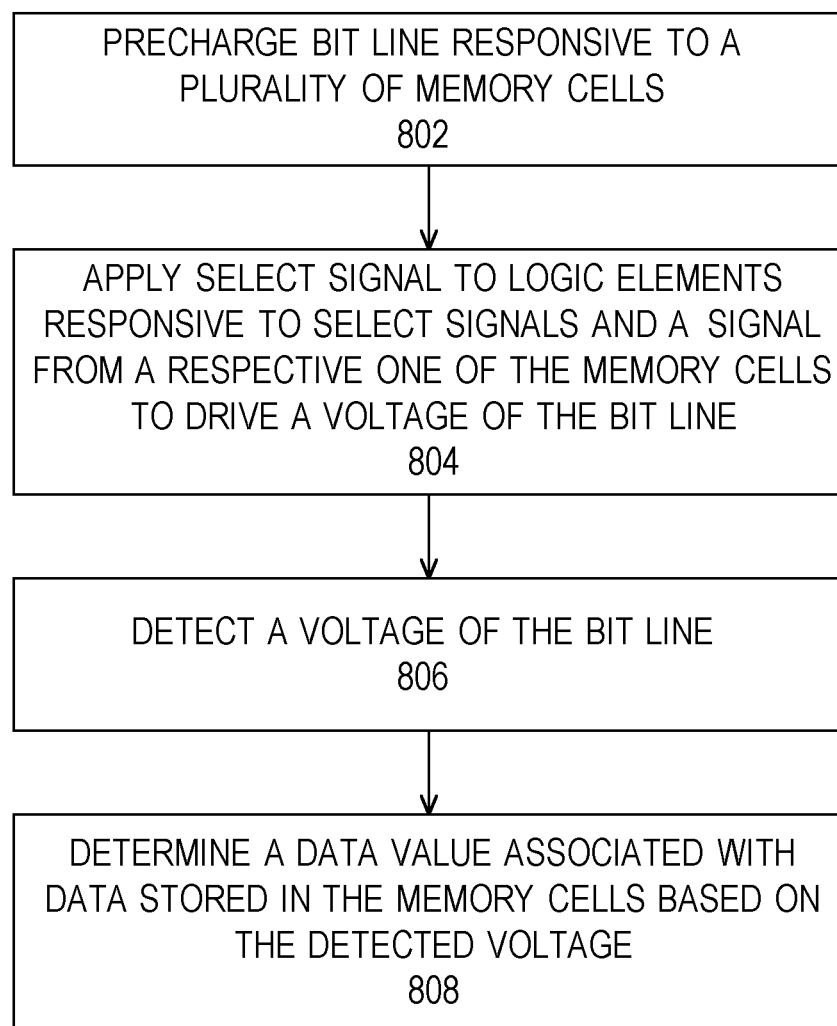
FIG. 8 is a flow diagram depicting a method of reading data from an array of memory cells in accordance with embodiments.

FIG. 8 is a flow diagram depicting a method of reading data from an array of memory cells in accordance with embodiments. While the steps of the method may be performed using a multitude of structures, reference is made to example structures herein for ease in understanding. The method includes precharging a bit line 102 that is responsive to a plurality of memory cells 206 of the array to a predetermined level at 802. A select signal is applied to an array of logic elements 208 at 804, each logic element 208 being responsive to the select signal and a signal from a respective one of the memory cells 206 of the array, where a voltage of the bit line 102 is driven by output signals from the logic elements 208. A voltage at the bit line 102 is detected at 806, and at 808 a data value associated with data stored in the array of memory cells 206 is determined based on the detected voltage.

Use of the various processes as described herein can provide a number of advantages. For example, use of the subject matter can provide high speed access to data in a memory, including processing of that data while in the memory, such that the data does not need to be output from the memory for certain aspects of that access and processing. In embodiments, access to the memory (e.g., for charge boosting of the output bit line) can be accomplished using a single select signal, resulting in low power consumption and high speed and low circuit control pin counts. In embodiments where an output capacitor of computing cells has an input node controlled at all active times by a logic element, the capacitor is not in a floating stage during operation, reducing leakage and other detrimental effects. The use of a logic element in the computing cells can also limit the need for time and power consuming equalization operations.

In one example, a memory circuit includes a bit line and a plurality of computing cells connected to the bit line. Each of the plurality of computing cells includes a memory element, having a data output terminal; a logic element, having a first input terminal, a second input terminal and an output terminal, wherein the first input terminal is coupled to the data output terminal of the memory element, the second input terminal receives a select signal; and a capacitor, having a first terminal and a second terminal, where the first terminal is coupled to the output terminal of the logic element, the second terminal is coupled to the bit line. A voltage of the bit line is driven by the plurality of computing cells.

In another example, a method of reading data from an array of memory cells includes precharging a bit line that is responsive to a plurality of memory cells of the array to a predetermined level. A select signal is applied to an array of logic elements, each logic element being responsive to the select signal and a signal from a respective one of the memory cells of the array, where a voltage of the bit line is driven by output signals from the logic elements. A voltage at the bit line is detected, and a data value associated with data stored in the array of memory cells is determined based on the detected voltage.

In a further embodiment, a memory cell includes a storage element configured to store one bit of data. A logic gate is configured to receive a signal from the storage element and a select signal. And a capacitor configured to receive an output signal from the logic gate at a first terminal, where the capacitor is configured for connection to a bit line via a second terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory circuit comprising:
   a bit line; and
   a plurality of computing cells connected to the bit line, each computing cell comprising:
      a memory element having a data output terminal and configured to store a bit of data and to provide the bit of data at the data output terminal when data are read from the computing cells; and
      a logic element having a first input terminal and a second input terminal, wherein the first input terminal is coupled to the data output terminal of the memory element and the second input terminal is configured to receive a select signal.

2. The memory circuit of claim 1, wherein the logic element is configured to output a high level or a low level based on the select signal and a signal from the data output terminal of the memory element.

3. The memory circuit of claim 1, wherein the computing cells are configured to drive a voltage of the bit line.

4. The memory circuit of claim 1, further comprising a voltage detector coupled to the bit line.

5. The memory circuit of claim 1, wherein the memory circuit is configured to determine a number of computing cells having a particular value based on a voltage of the bit line.

6. The memory circuit of claim 1, wherein the memory circuit is configured to determine a number of computing cells having a particular value based on at least one of a total number of computing cells, a capacitance of a capacitor, a load capacitance, and a voltage of the bit line.

7. The memory circuit of claim 1, wherein a particular computing cell is configured to drive a voltage of the bit line higher when the memory element contains a 1 data value and when the select signal is high.

8. The memory circuit of claim 1, wherein the logic element of a particular computing cell comprises a NOR gate and the NOR gate receives an inversed signal from the memory element and an inversed select signal.

9. The memory circuit of claim 1, wherein the logic element of a particular computing cell comprises an AND gate and the AND gate receives a signal from the data output terminal of the memory element and the select signal.

10. The memory circuit of claim 1, further comprising a pre-charge circuit configured to drive the bit line low prior to assertion of the select signal.

11. The memory circuit of claim 1, wherein a particular computing cell is configured to drive a voltage of the bit line lower when the memory element contains a 1 data value and when the select signal is high.

12. The memory circuit of claim 1, wherein the logic element of the particular computing cell comprises an OR gate and the OR gate receives an inversed signal from the memory element and an inversed select signal.

13. The memory circuit of claim 1, wherein the logic element of a particular computing cell comprises a NAND gate and the NAND gate receives a signal from the data output terminal of the memory element and the select signal.

14. The memory circuit of claim 1, further comprising a pre-charge circuit configured to drive the bit line high prior to assertion of the select signal.

15. A method of reading data from an array of memory cells, the method comprising:
   applying a select signal to an array of logic elements, each logic element being responsive to the select signal and a signal from a respective memory cell, wherein a voltage of a bit line is driven by output signals from the logic elements and a memory cell is configured to store a bit of data and to output the bit of data when data are read from the memory cells;
   detecting a voltage at the bit line; and
   determining a data value associated with data stored in the memory cells based on the detected voltage.

16. The method of claim 15, further comprising storing data in each of the memory cells.

17. The method of claim 15, wherein a capacitor is positioned between a particular one of the logic elements and the bit line and a node between the particular logic element and the capacitor is driven to one of two levels when the memory cells is operational.

18. The method of claim 15, wherein a particular memory cell drives the bit line away from a precharged level of the bit line when the select signal is active and the particular memory cell stores a predetermined data value.

19. The method of claim 15, wherein the data value indicates a number of memory cells having a predetermined data value.

20. A memory device comprising:
   a plurality of memory cells, each memory cell including:
      a storage element configured to store one bit of data and to output the bit of data when the bit of data is read from the memory cell; and
      a logic gate configured to receive a signal that is a representation of the bit of data stored in the storage element and a select signal.

* * * * *